US012119817B2

(12) United States Patent
Song et al.

(10) Patent No.: US 12,119,817 B2
(45) Date of Patent: Oct. 15, 2024

(54) GATE DRIVER CIRCUITS WITH INDEPENDENTLY TUNABLE PERFORMANCE CHARACTERISTICS

(71) Applicant: ABB Schweiz AG, Baden (CH)

(72) Inventors: Xiaoqing Song, Apex, NC (US); Utkarsh Raheja, Raleigh, NC (US); Pietro Cairoli, Cary, NC (US); Sayan Acharya, Schenectady, NY (US)

(73) Assignee: ABB Schweiz AG, Baden (CH)

( * ) Notice: Subject to any disclaimer, the term of this patent is extended or adjusted under 35 U.S.C. 154(b) by 491 days.

(21) Appl. No.: 17/549,520

(22) Filed: Dec. 13, 2021

(65) Prior Publication Data

US 2023/0188134 A1     Jun. 15, 2023

(51) Int. Cl.
*H03K 17/687*     (2006.01)
*H02H 3/087*     (2006.01)
*H02H 7/22*     (2006.01)

(52) U.S. Cl.
CPC ......... *H03K 17/6874* (2013.01); *H02H 3/087* (2013.01); *H02H 7/22* (2013.01)

(58) Field of Classification Search
CPC . H03K 17/6874; H03K 17/0822–0828; H02H 3/08; H02H 3/087
See application file for complete search history.

(56) References Cited

U.S. PATENT DOCUMENTS

| 8,422,182 B2 | 4/2013 | Boudet et al. |
| 10,276,321 B2 | 4/2019 | Kennedy et al. |
| 2010/0277006 A1 | 11/2010 | Urciuoli |

(Continued)

FOREIGN PATENT DOCUMENTS

| DE | 4313882 C1 | 8/1994 | |
| DE | 102012200981 A1 * | 9/2012 | ......... H03K 17/0828 |

(Continued)

OTHER PUBLICATIONS

Translation of DE 10 2012 200 981 A1. (Year: 2012).*

(Continued)

*Primary Examiner* — Jared Fureman
*Assistant Examiner* — Christopher J Clark
(74) *Attorney, Agent, or Firm* — McCarter & English, LLP (57) ABSTRACT

A gate driver circuit is provided that includes a turn-on path, a turn-off path, and a fast discharge path. The turn-on path is couplable between a gate of a solid-state switch and a voltage turn-on signal ($VG_{ON}$) from a gate driver, where the turn-on path defines a turn-on time for the solid-state switch. The turn-off path is couplable between the gate and a voltage turn-off signal ($VG_{OFF}$) from the gate driver, where the turn-off path defines a turn-off time for the solid-state switch. The fast discharge path is selectively couplable in parallel with the turn-off path during a portion of a gate-to-source voltage ($V_{GS}$) transition for the solid-state switch, where the turn-off path in parallel with the fast discharge path defines a turn-off delay for the solid-state switch and each of the turn-on time, the turn-off time, and the turn-off delay are independently configurable.

20 Claims, 8 Drawing Sheets

(56) References Cited

U.S. PATENT DOCUMENTS

2017/0077805 A1\* 3/2017 Sicard .................... H02M 1/08
2019/0103742 A1 4/2019 Kennedy et al.

FOREIGN PATENT DOCUMENTS

EP 0197658 A2 10/1986
EP 0272898 A2 6/1988

OTHER PUBLICATIONS

Yuxiang Shi et al., "Short-Circuit Protection of 1200V SiC MOSFET T-type Module in PV Inverter Application", 2016 EEE Energy Conversion Congress and Exposition, Sep. 2016.
Eckel, et al., "Optimization of the Turn-Off Performance of IGBT at Overcurrent and Short-Circuit Current", 1993 Fifth European Conference on Power Electronics and Applications, Sep. 1993.
V. John, et al., "High Performance Active Gate Drive for High Power IGBTs", Conference Record of 1998 IEEE Industry Applications Conference, Oct. 1998.
Shu et al., "Active Current Source IGBT Gate Drive with Closed-Loop di/dt and dv/dt Control", IEEE Transactions on Power Electronics, vol. 32 Issue 5, May 2017.
Kinoshita et al., "100A Solid State Circuit Breaker using Monolithic GaN Bidirectional Switch with Two-Step Gate- Discharging Technique", 2020 IEEE Applied Power Electronics Conference and Exposition, Mar. 2020.

\* cited by examiner

GATE DRIVER CIRCUITS WITH INDEPENDENTLY TUNABLE PERFORMANCE CHARACTERISTICS

BACKGROUND

The field of the disclosure relates to solid-state switches, and more particularly, to controlling turn-off in solid-state switches.

Solid-state switches are used in a variety of implementations, including solid-state circuit breakers. When used as switching elements in solid-state circuit breakers and a fault current is detected, the gate drivers operating the solid-state switches apply a turn-off signal to the solid-state switches to interrupt the fault current. However, the fault current is not turned off immediately after applying the turn-off signal. Instead, a delay is present between the time the turn-off signal is applied and a time at which the current in the solid-state switches begins to decrease. During the delay, the fault currents can rise to high levels, potentially damaging the solid-state switches.

Reducing the delay through modifications in the gate driver typically also reduces the turn-off time of the solid-state switches, which can be undesirable in some implementations. For example, wide band-gap devices (e.g., Silicon Carbide (SiC) solid-state switches) exhibit exceptionally high switching speeds, which can generate turn-off voltage spikes based on a high di/dt in the fault current during shut-off and the parasitic inductances present in the solid-state circuit breaker. Therefore, two contradictory requirements are present, which results in less-than-optimal performance in typical gate drivers in both controlling the turn-off delay and also controlling the turn-off time of solid-state switches.

Thus, it is desirable to improve the performance of gate drive circuits for solid-state switches, to enable control of both the turn-off delay and the turn-off time of solid-state switches.

BRIEF DESCRIPTION

In one aspect, a gate driver circuit is provided. The gate driver circuit includes a turn-on circuit path, a turn-off circuit path, and a fast discharge circuit path. The turn-on circuit path is couplable between a gate of a solid-state switch and a voltage turn-on signal ($VG_{ON}$) from a gate driver, where the turn-on circuit path defines a turn-on time for the solid-state switch. The turn-off circuit path is couplable between the gate and a voltage turn-off signal ($VG_{OFF}$) from the gate driver, where the turn-off circuit path defines a turn-off time for the solid-state switch. The fast discharge circuit path is selectively couplable in parallel with the turn-off circuit path during a portion of a gate-to-source voltage ($V_{GS}$) transition for the solid-state switch, where the turn-off circuit path in parallel with the fast discharge circuit path defines a turn-off delay for the solid-state switch, and where each of the turn-on time, the turn-off time, and the turn-off delay are independently configurable.

In another aspect, a solid-state circuit breaker is provided. The solid-state circuit breaker includes a first output, a second output, at least one gate driver configured to generate turn-on signal $VG_{ON}$ and a turn-off signal $VG_{OFF}$, a pair of anti-series solid-state switches selectively coupling the first output with the second output, and a gate driver circuit. The gate driver circuit is coupled to the at least one gate driver and a first solid-state switch of the pair of anti-series solid state switches. The gate driver includes a turn-on circuit path, a turn-off circuit path, and a fast discharge circuit path. The turn on-circuit path is coupled between a gate of the first solid-state switch and $VG_{ON}$, where the turn-on circuit path defines a turn-on time for the first solid-state switch. The turn-off circuit path is coupled between the gate of the first solid-state switch and $VG_{OFF}$, where the turn-off circuit path defines a turn-off time for the first solid-state switch. The fast discharge circuit path is selectively coupled in parallel with the turn-off circuit path during a portion of a gate-to-source voltage ($V_{GS}$) transition for the first solid-state switch, where the turn-off circuit path coupled in parallel with the fast discharge circuit path defines a turn-off delay for the first solid-state switch, and where each of the turn-on time, the turn-off time, and the turn-off delay are independently configurable.

In yet another aspect, an apparatus is provided. The apparatus includes a gate driver configured to generate a turn-off signal $VG_{OFF}$, a solid-state switch including a gate, a drain, and a source, a turn-off circuit path coupled between the gate of the solid-state switch and $VG_{OFF}$, and a fast discharge circuit path. The fast discharge circuit path includes one of (a) a first circuit comprising a first resistor having a first terminal coupled to $VG_{OFF}$ and a second terminal, a n-channel Field-Effect Transistor (FET) having a drain coupled to the gate of the solid-state switch, a source coupled to the second terminal of the first resistor, and a gate, a first Zener diode having a cathode coupled to the drain of the n-channel FET and an anode coupled to the gate of the n-channel FET, and a second resistor having a third terminal coupled to the gate of the n-channel FET and a fourth terminal coupled to the source of the n-channel FET; and (b) a second circuit comprising a third resistor having a fifth terminal coupled to $VG_{OFF}$ and a sixth terminal, a p-channel FET having a source coupled to the gate of the solid-state switch, a drain coupled to the sixth terminal of the third resistor, and a gate, a fourth resistor having a seventh terminal coupled to the source of the p-channel FET and a eighth terminal coupled to the gate of the p-channel FET, a fifth resistor having a ninth terminal coupled to the gate of the p-channel FET and a tenth terminal, and a second Zener diode having a cathode coupled to the tenth terminal of the fifth resistor and an anode coupled to a source of the solid-state switch.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

Figure 1:
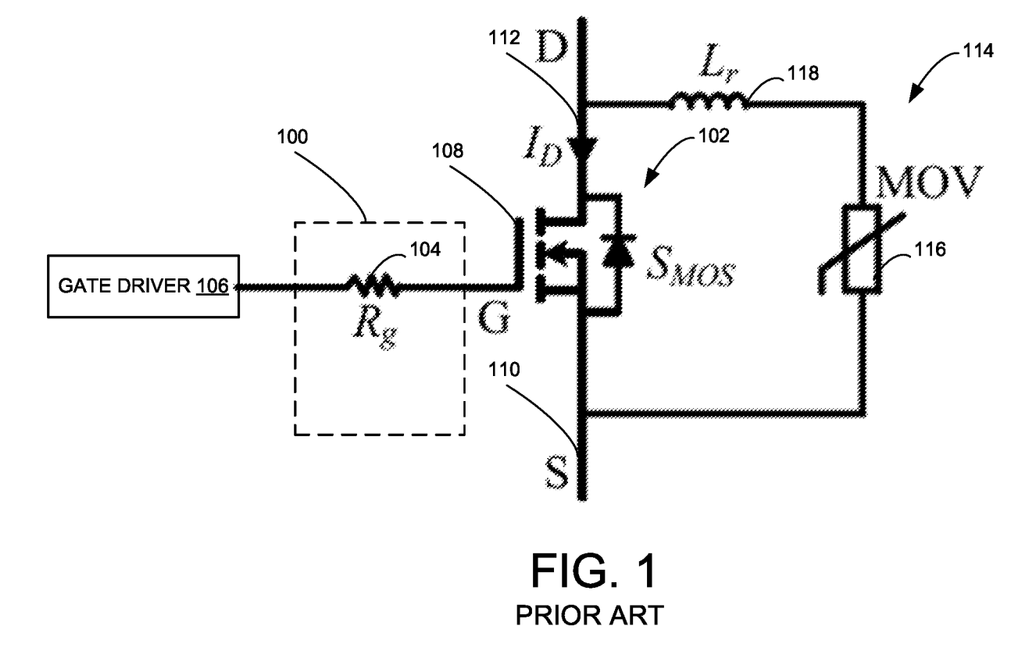
FIG. 1 is a known gate drive circuit for a solid-state switch.
Figure 2:
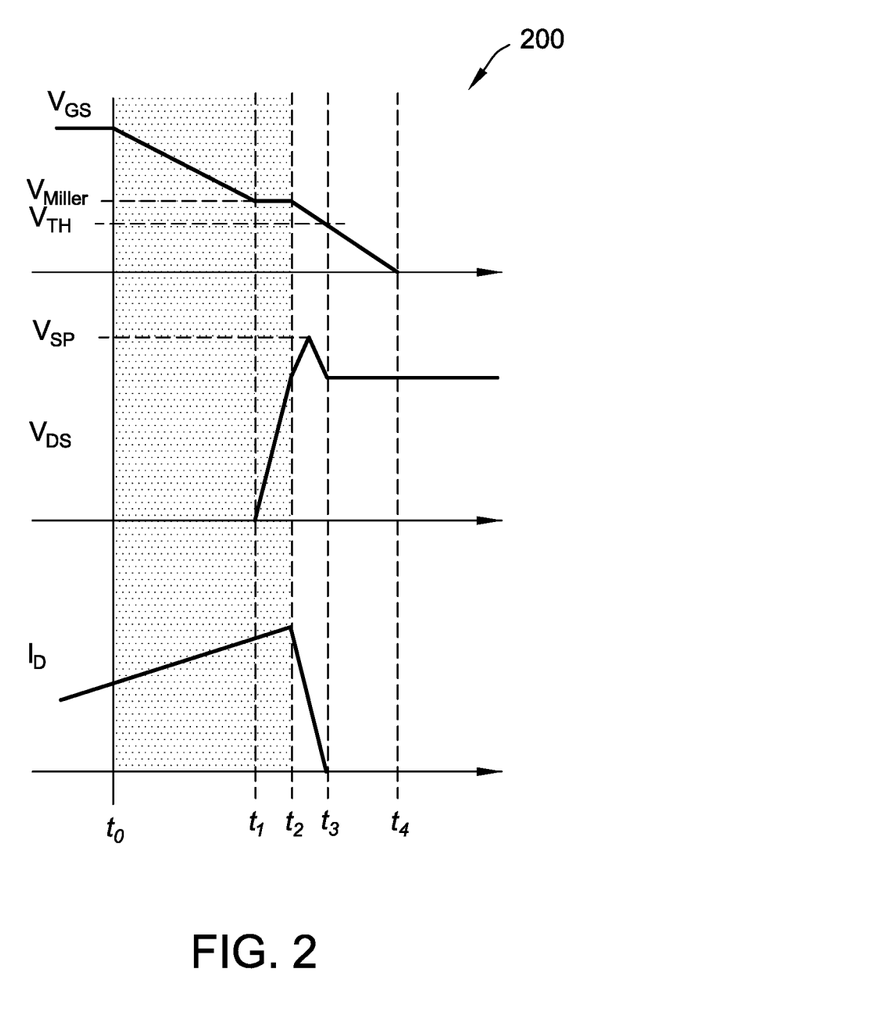
FIG. 2 is a switching diagram for the gate drive circuit of FIG. 1.
Figure 3:
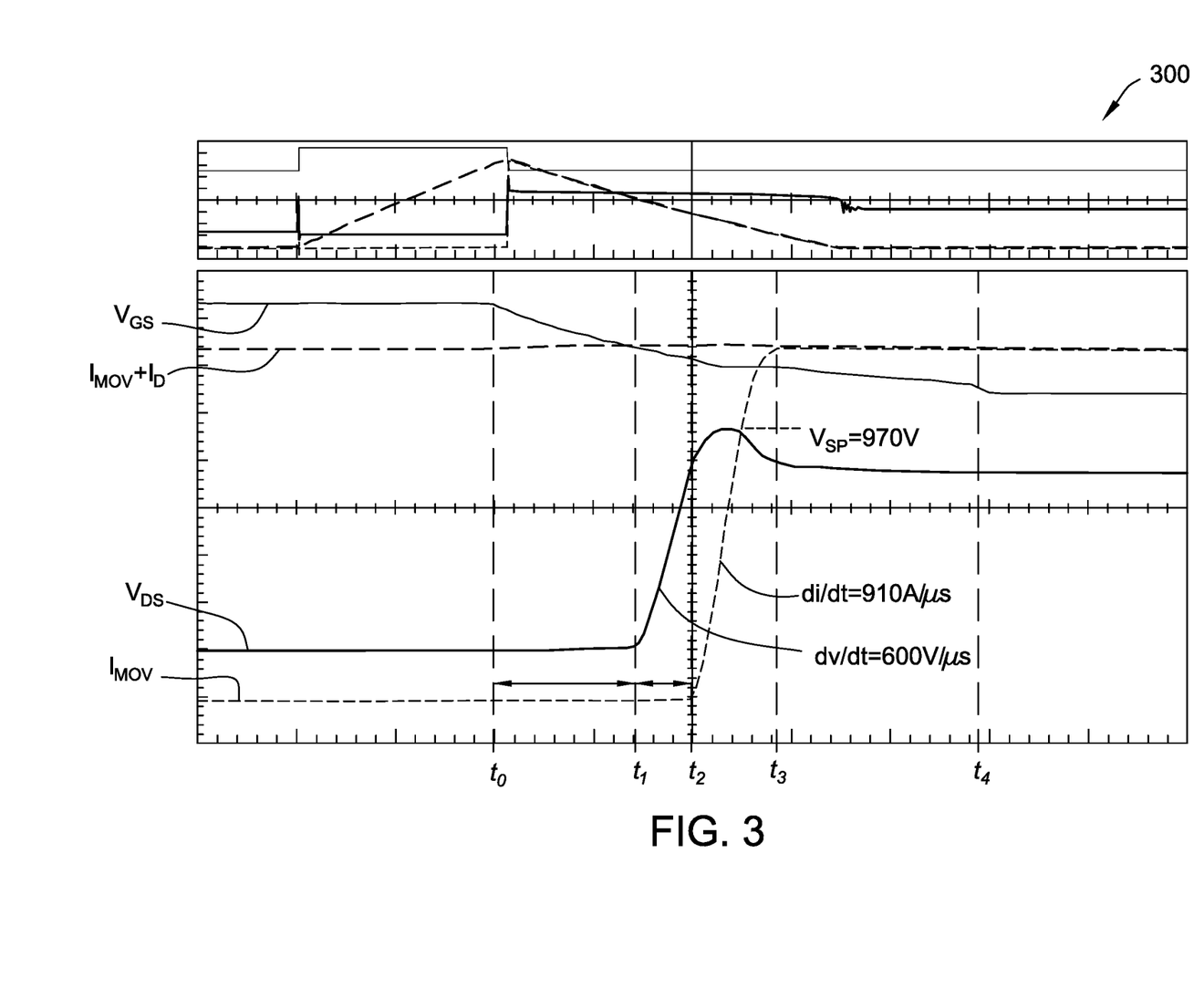
FIG. 3 illustrates experimental switching waveforms for the gate drive circuit of FIG. 1.

FIG. 1 is known gate driver circuit 100 for a solid-state switch 102, FIG. 2 is a switching diagram 200 for gate driver circuit 100, and FIG. 3 illustrates experimental switching waveforms for gate driver circuit 100. Referring to FIG. 1, gate driver circuit 100 includes a gate resistor $R_g$ 104 connected between a gate driver 106 and a gate 108 of solid-state switch 102 to control the switching speed of solid-state switch 102.

FIG. 2 illustrates the turn-off waveforms of solid-state switch 102 (e.g., a Metal-Oxide Semiconductor Field-Effect Transistor (MOSFET) in FIG. 1) using gate driver circuit 100. The turnoff process is divided into four time intervals in FIG. 2. At to, the turn-off command is generated by gate driver 106, and the gate 108 to source 110 voltage $V_{GS}$ (the voltage across the parasitic capacitances of gate 108 of solid-state switch 102) is slowly decreasing to the Miller plateau voltage, VMiller, of solid-state switch 102. The rate at which $V_{GS}$ decreases is limited by the value of $R_g$ 104. Smaller values of $R_g$ 104 allow higher gate current to discharge the gate capacitances of solid-state switch 102, resulting in a faster rate at which $V_{GS}$ decreases. From $t_1$ to $t_2$, $V_{GS}$ remains at the Miller plateau voltage and a drain 112 to source 110 voltage $V_{DS}$ of solid-state switch 102 starts to increase. During this period, drain 112 to source 110 current $I_D$ of solid-state switch 102 keeps increasing in short circuit circumstances. From $t_2$, the gate voltage $V_{GS}$ continues to decrease to the threshold voltage $V_{TH}$ of solid-state switch 102, and the drain current $I_D$ starts to decrease. The di/dt of the drain current $I_D$ is proportional to the dv/dt of the gate voltage $V_{GS}$. As the dv/dt of $V_{GS}$ is determined by the value of $R_g$ 104, the di/dt of the drain current $I_D$ is also determined by the value of $R_g$ 104. A larger value of $R_g$ 104 results in a slower turn-off di/dt of the drain current $I_D$. In FIG. 2, the time from $t_0$ to $t_2$ is defined as the turn-off delay time (the shaded area as shown in FIG. 2), since the drain current $I_D$ starts to interrupt at $t_2$. To summarize, a smaller resistance for $R_g$ 104 results in a faster switching speed and a short turn-off delay time, while a larger resistance for $R_g$ 104 results in a slower switching speed and a long turn-off delay time. However, gate driver circuit 100 of FIG. 1 fails to provide both a slower switching speed and a shorter turn-off delay time at the same time.

When a fault (e.g., a short circuit) occurs in a power system using gate driver circuit 100, gate driver 106 sends out the turn-off command to solid-state switch 102 to interrupt the fault current. However, the fault current is not turned off immediately after sending out the turn-off command (e.g., at to in FIG. 2), and there is usually a certain delay time (e.g., from $t_0$ to $t_2$ in FIG. 1) before the fault current starts falling. During the turn-off delay time, the fault current continues increasing at certain di/dt, which may reach very high peak fault current level. For example, the short circuit di/dt is quite high in some power systems due to high system voltages and low loop inductances, and in some cases, the turn-off delay time could be as long as 10 microseconds or even longer. This could lead to the short circuit fault current increasing to extremely high value within the turn-off delay time, heavily stressing the components in the power system and causing more difficulties to interrupt the fault current.

During the turn-off process in a solid-state circuit breaker that utilizes solid-state switch 102, the current is commutated from the solid-state switch 102 to a snubber 114 (e.g., a metal oxide varistor (MOV) 116 in series with a loop inductance $L_r$ 118 as shown in FIG. 1). Higher switching speed due to the lower gate resistance $R_g$ 104 along with loop inductance $L_r$ 118 in snubber 114 may cause a significant voltage spike across solid-state switch 102, which may exceed the safe operating range of solid-state switch 102. This may result in a reduction in the reliability for the solid-state circuit breaker. This situation is worse for solid-state circuit breakers that utilize Wide Band Gap (WBG) power devices (e.g. Silicon Carbide (SiC) MOSFETs), due to their inherent higher switch speed (high dv/dt and di/dt) characteristics.

In power electronics converter applications, higher switching speed is usually favorable to reduce the switching losses and to reach a higher switching frequency. However, in solid state circuit breaker applications, a higher switching speed is not always desirable. In some cases, a lower switching speed may be preferred to reduce the turn-off voltage spikes, due to the relatively large loop inductances $L_r$ 118 between solid-state switch 102 and snubber 114, which are difficult to minimize. In this regard, gate driver circuit 100 tuning is provided only by adjusting the value of $R_g$ 104, which fails to address the contradictory requirements of a short turn-off delay time and a slow turn-off di/dt. FIG. 3 illustrates switching waveforms 300 for a 1500 Amp current turn-off simulation using a SiC MOSFET as solid-state switch 102, controlled by an 80Ω value for $R_g$ 104. The turn-off delay time is 5 μs (3.5 μs+1.5 μs), and the turn-off di/dt is as high as 910 A/μs, which causes a 970V voltage spike across solid-state switch 102.

The embodiments described herein address these and other shortcomings of typical gate drive circuits, such as gate driver circuit 100, by providing enhanced gate drive circuits that have independently tunable parameters that include both the turn-off delay time and the turn-off time, thereby providing technical benefits.

Figure 4:
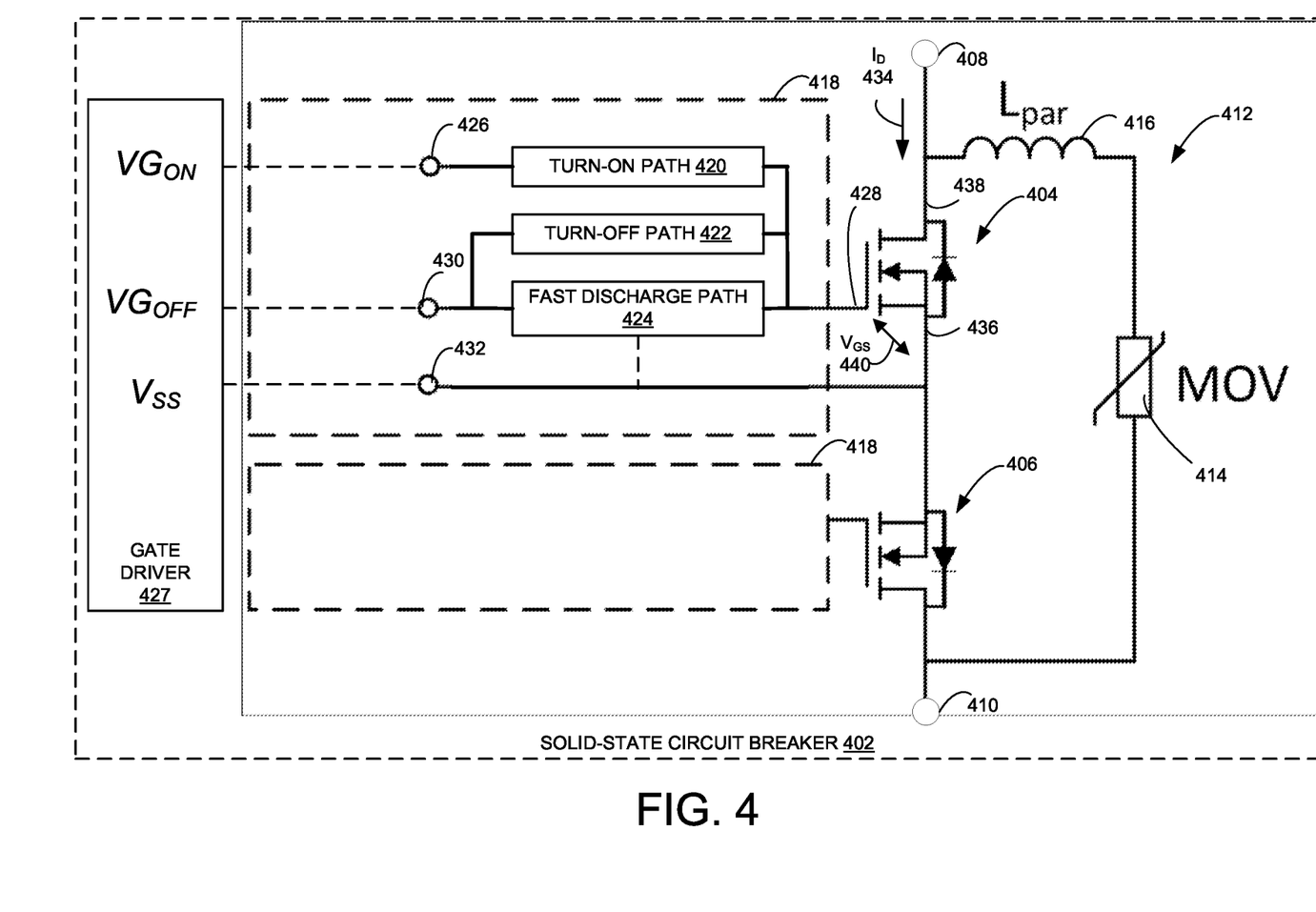
FIG. 4 is a schematic representation of a solid-state circuit breaker in an example embodiment.

FIG. 4 is a schematic representation of a Solid-State Circuit Breaker (SSCB) 402 in an example embodiment. In this embodiment, SSCB 402 includes a pair of anti-series solid-state switches 404, 406 which are used to selectively control a current path through SSCB 402 between output terminals 408, 410 of SSCB 402. Solid-state switches 404, 406 include SiC MOSFETs, Insulated Gate Bipolar Transistors (IGBTs), Gallium Nitride (GaN) FETs, Junction-gate FETs (JFETs), etc., in various embodiments. Although solid-state switches 404, 406 are illustrated as n-channel enhancement mode SiC MOSFETs in this embodiment, solid-state switches 404, 406 have other configurations in other embodiments.

In this embodiment, SSCB 402 includes a snubber circuit 412, which mitigates voltage transients across solid-state switches 404, 406 when solid-state switches 404, 406 transition from the on-state to the off-state. The configuration of snubber circuit 412, having a Metal Oxide Varistor (MOV) 414 in series with a parasitic inductance component 416 in this embodiment, is different in other embodiments.

In this embodiment, SSCB 402 utilizes an enhanced gate drive circuit 418 to control the operation of solid-state switches 404, 406. The specific details of enhanced gate drive circuit 418 is depicted for solid-state switch 404, to simplify the discussion of SSCB 402. However, enhanced gate drive circuit 418 for solid-state switch 406 may be the same or similar to what will be described with respect to solid-state switch 404.

In this embodiment, enhanced gate drive circuit 418 includes a turn-on circuit path 420, a turn-off circuit path 422, and a fast discharge circuit path 424. Each of circuit paths 420, 422, 424 are individually configurable to modify the operation of enhanced gate drive circuit 418 during turn-on and turn-off transitions for solid-state switch 404. In this embodiment, turn-on circuit path circuit 420 couples a $VG_{ON}$ signal 426 of a gate driver 427 to a gate 428 of solid-state switch 404. $VG_{ON}$ signal 426 is a voltage signal generated by gate driver 427 when gate driver 427 is commanded to turn on solid-state switch 404. Turn-off circuit path 422 couples a $VG_{OFF}$ signal 430 of gate driver 427 to gate 428 of solid-state switch 404. $VG_{OFF}$ signal 430 is a voltage signal generated by gate driver 427 when gate driver 427 is commanded to turn off solid-state switch 404. A $V_{SS}$ signal 432 is a common source signal for solid-state switches 404, 406, and is used by gate driver 427 to level-shift one or more of $VG_{ON}$ signal 426 and $VG_{OFF}$ signal 430. Further in this embodiment, fast discharge circuit path 424 couples $VG_{OFF}$ signal 430 of gate driver 427 with gate 428 of solid-state switch 404.

Turn-on circuit path 420 includes any system, component, or device which is tunable, either statically by component selection or dynamically by other means, to control how solid-state switch 404 transitions from an off-state (e.g., non-conducting) to an on-state (e.g., conducting). For example, turn-on circuit path 420 may be tuned to control the turn-on time of solid-state switch 404 and/or a time rate of change (di/dt) of a drain current ($I_D$) 434 for solid-state switch 404 when solid-state switch 404 transitions from an off-state to an on-state.

Turn-off circuit path 422 includes any system, component, or device which is tunable, either statically by component selection or dynamically by other means, to control how solid-state switch 404 transitions from an on-state to an off-state during a portion of the turn-off time when fast discharge circuit path 424 is disabled. For example, turn-off circuit path 422 may be tuned to control the turn-off time and/or a time rate of change (di/dt) of $I_D$ 434 for solid-state switch 404 when solid-state switch 404 transitions from an on-state to an off-state beginning at or around the threshold voltage $V_{TH}$ of solid-state switch 404. Limiting the di/dt of $I_D$ 434 also limits the transient voltages generated in snubber circuit 412 based on the parasitic inductance component $L_{par}$ 416. In this embodiment, turn-off circuit path 422 is coupled in parallel with fast discharge circuit path 424.

Fast discharge circuit path 424 includes any system, component, or device which is tunable, either statically by component selection or dynamically by other means, to control how gate 428 to source 436 voltage ($V_{GS}$) 440 for solid-state switch 404 transitions from an on-state to $V_{TH}$ through the miller plateau voltage. The miller plateau voltage for solid-state switch 404 is generally based on the coupling capacitance between gate 428 and drain 438 and/or source 436 of solid-state switch 404. For example, during turn-off events, the decreasing voltage between drain 438 and source 436 charges gate 428 with a current, partially offsetting the drive current used to reduce $V_{GS}$ 440 of solid-state switch 404 during on-to-off transitions. Fast discharge circuit path 424 mitigates these effects by providing a low impedance path between gate 428 and $VG_{OFF}$ signal 430 of gate driver 427 while solid-state switch 404 transitions through the miller plateau voltage to $V_{TH}$. In response to $V_{GS}$ 440 being at or about $V_{TH}$, fast discharge circuit path 424 is disabled and turn-off circuit path 422 is used to control the turn-off of solid-state switch 404 and to control di/dt of $I_D$ 434. In some embodiments, fast discharge circuit path 424 is also electrically coupled to $V_{SS}$ signal 432.

Figure 5:
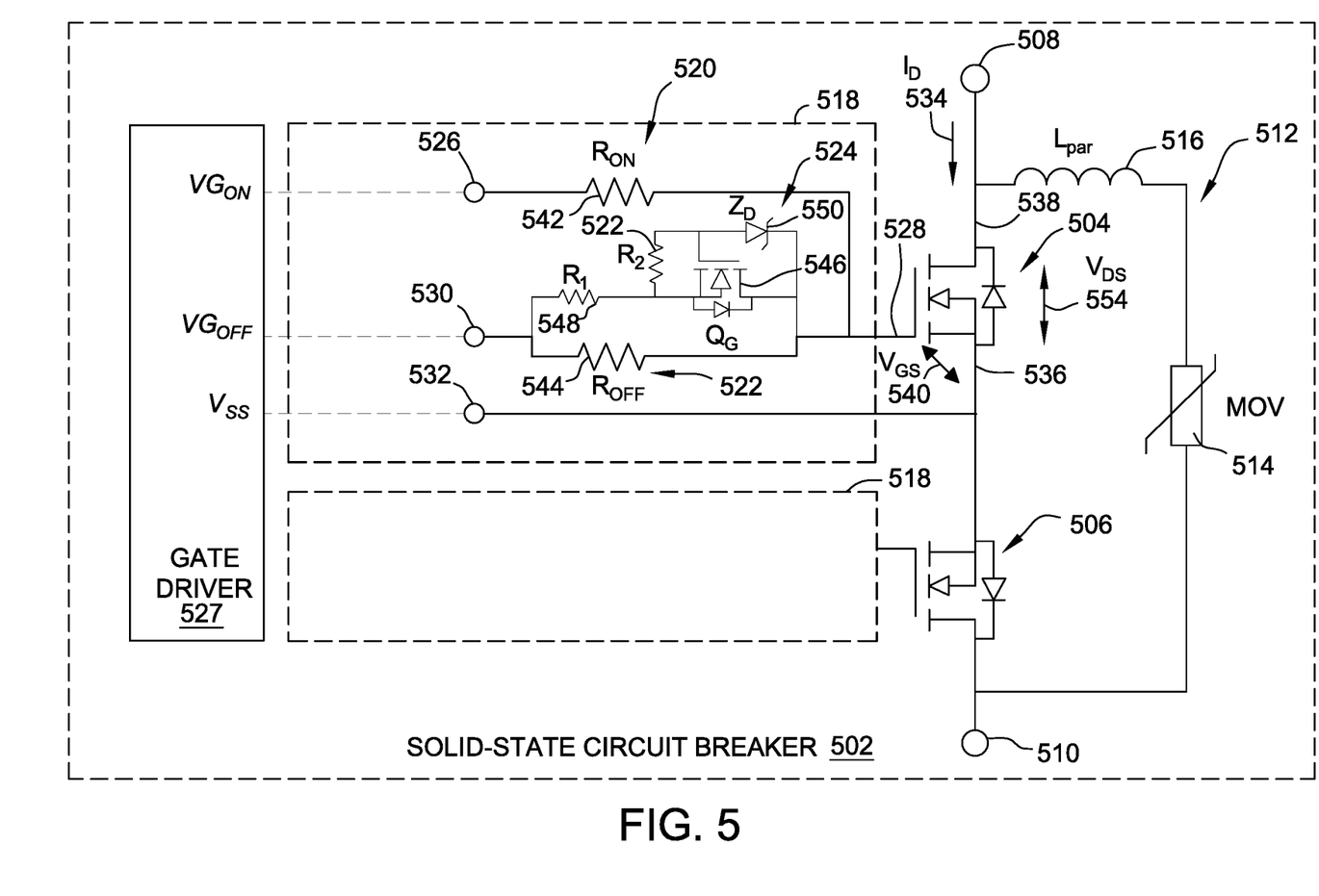
FIG. 5 is a schematic representation of another solid-state circuit breaker in an example embodiment.

FIG. 5 is a schematic representation of a SSCB 502 in an example embodiment. In this embodiment, SSCB 502 includes a pair of anti-series solid-state switches 504, 506 which are used to selectively control a current path through SSCB 502 between output terminals 508, 510 of SSCB 502. Solid-state switches 504, 506 include SiC MOSFETs, IGBTs, GaN FETs, JFETs, etc., in various embodiments. Although solid-state switches 504, 506 are illustrated as n-channel enhancement mode SiC MOSFETs in this embodiment, solid-state switches 504, 506 have other configurations in other embodiments.

In this embodiment, SSCB 502 includes a snubber circuit 512, which mitigates voltage transients across solid-state switches 504, 506 when solid-state switches 504, 506 transition from the on-state to the off-state. The configuration of snubber circuit 512, having a MOV 514 in series with a parasitic inductance component $L_{par}$ 516 in this embodiment, is different in other embodiments.

In this embodiment, SSCB 502 utilizes an enhanced gate drive circuit 518 to control the operation of solid-state switches 504, 506. The specific details of enhanced gate drive circuit 518 is depicted for solid-state switch 504, to simplify the discussion of SSCB 502. However, enhanced gate drive circuit 518 for solid-state switch 506 may be the same or similar to what will be described with respect to solid-state switch 504.

In this embodiment, enhanced gate drive circuit 518 includes a turn-on circuit path 520, a turn-off circuit path 522, and a fast discharge circuit path 524. Each of circuit paths 520, 522, 524 are individually configurable to modify the operation of enhanced gate drive circuit 518 during turn-on and turn-off transitions for solid-state switch 504. In this embodiment, turn-on circuit path circuit 520 couples a $VG_{ON}$ signal 526 of a gate driver 527 to a gate 528 of solid-state switch 504. $VG_{ON}$ signal 526 is a voltage signal generated by gate driver 527 when gate driver 527 is commanded to turn on solid-state switch 504. Turn-off circuit path 522 couples a $VG_{OFF}$ signal 530 of gate driver 527 to gate 528 of solid-state switch 504. $VG_{OFF}$ signal 530 is a voltage signal generated by gate driver 527 when gate driver 527 is commanded to turn off solid-state switch 504. A $V_{SS}$ signal 532 is a common source signal for solid-state switches 504, 506, and is used by gate driver 527 to level-shift one or more of $VG_{ON}$ signal 526 and $VG_{OFF}$ signal 530. Further in this embodiment, fast discharge circuit path 524 couples $VG_{OFF}$ signal 530 of gate driver 527 with gate 528 of solid-state switch 504.

Turn-on circuit path 520 includes any system, component, or device which is tunable, either statically by component selection or dynamically by other means, to control how solid-state switch 504 transitions from an off-state (e.g., non-conducting) to an on-state (e.g., conducting). For example, turn-on circuit path 520 may be tuned to control the turn-on time of solid-state switch 504 and/or a time rate of change (di/dt) of a drain current ($I_D$) 534 for solid-state switch 504 when solid-state switch 504 transitions from an off-state to an on-state. In this embodiment, turn-on circuit path 520 includes a resistor $R_{ON}$ 542 coupled between $VG_{ON}$ signal 526 of gate driver 527 and gate 528 of solid-state switch 504. $R_{ON}$ 542 has a resistance value selected to control the turn-on time of solid-state switch 504 and/or the di/dt of $I_D$ 534, and also generally has a resistance value that is based on the source current capability of the $VG_{ON}$ signal 526 generated by gate driver 527.

Turn-off circuit path 522 includes any system, component, or device which is tunable, either statically by component selection or dynamically by other means, to control how solid-state switch 504 transitions from an on-state to an off-state during a portion of the turn-off time when fast discharge circuit path 524 is disabled. For example, turn-off circuit path 522 may be tuned to control the turn-off time and/or a time rate of change (di/dt) of $I_D$ 534 for solid-state switch 504 when solid-state switch 504 transitions from an on-state to an off-state beginning at or around $V_{TH}$. Limiting the di/dt of $I_D$ 534 also limits the transient voltages generated in snubber circuit 512 based on the parasitic inductance component $L_{par}$ 516. In this embodiment, turn-off circuit path 522 includes a resistor $R_{OFF}$ 544 coupled between $VG_{OFF}$ signal 530 of gate driver 527 and gate 528 of solid-state switch 504. $R_{OFF}$ 544 has a resistance value selected to control the turn-of time of solid-state switch 504 and/or the di/dt of $I_D$ 534 during the portion of the turn-off time when fast discharge circuit path 524 is disabled (e.g., when $V_{GS}$ 540 is at or about $V_{TH}$ for solid-state switch 504), and also generally has a resistance value that is based on the sink current capability of the $VG_{OFF}$ signal 530 generated by gate driver 527.

Fast discharge circuit path 524 includes any system, component, or device which is tunable, either statically by component selection or dynamically by other means, to control how $V_{GS}$ 540 for solid-state switch 504 transitions from an on-state through the miller plateau voltage to $V_{TH}$ for solid-state switch 504. Fast discharge circuit path 524 is selectively coupled in parallel with turn-off circuit path 522 and provides a low impedance electrical path between gate 528 of solid-state switch 504 and $VG_{OFF}$ signal 530 of gate driver 527 while $V_{GS}$ 540 of solid-state switch 504 transitions through the miller plateau voltage to $V_{TH}$. In response to $V_{GS}$ 540 being at or about $V_{TH}$ of solid-state switch 504, fast discharge circuit path 524 is disabled and turn-off circuit path 522 is used to control the turn-off of solid-state switch 504 and to control the di/dt of $I_D$ 534.

In this embodiment, fast discharge circuit path 524 includes an n-channel FET $Q_G$ 546 is series with a resistor $R_1$ 548 between gate 528 of solid-state switch 504 and $VG_{OFF}$ signal 530. A Zener diode $Z_D$ 550 has a cathode coupled to gate 528 of solid-state switch 504 and an anode coupled to a gate of $Q_G$ 546. A resistor $R_2$ 552 is coupled between the gate of $Q_G$ 546 and a source of $Q_G$ 546.

During turn-off events for solid-state switch 504, a low impedance path exits between $VG_{OFF}$ signal 530 and gate 528 through $Q_G$ 546 and $R_1$ 548 while |$VG_{OFF}$ signal 530|+$V_{GS}$ 540−$V_{TOG}$>$V_Z$, where $V_{TOG}$ is the threshold voltage for $Q_G$ 546 and $V_Z$ is the Zener breakdown voltage for $Z_D$ 550.

When $V_{GS}$ 540 discharges below ($V_Z$−|$VG_{OFF}$ signal 530|+$V_{TOG}$), the low impedance path through $Q_G$ 546 and $R_1$ 548 is disabled, and the discharge path continues through $R_{OFF}$ 544. Generally, $V_Z$ is equal to about |$VG_{OFF}$ signal 530|+$V_{GSP}$, where $V_{GSP}$ is the gate plateau voltage of solid-state switch 504. $R_1$ 548 is selected based on the turn-off delay desired for solid-state switch 504, and $R_2$ 552 is selected such that (|$VG_{OFF}$ signal 530|+$V_{GS}$ 540−$V_Z$)*($R_2$ 552/($R_1$ 548+$R_2$ 552))<$V_{TOG}$.

Figure 6:
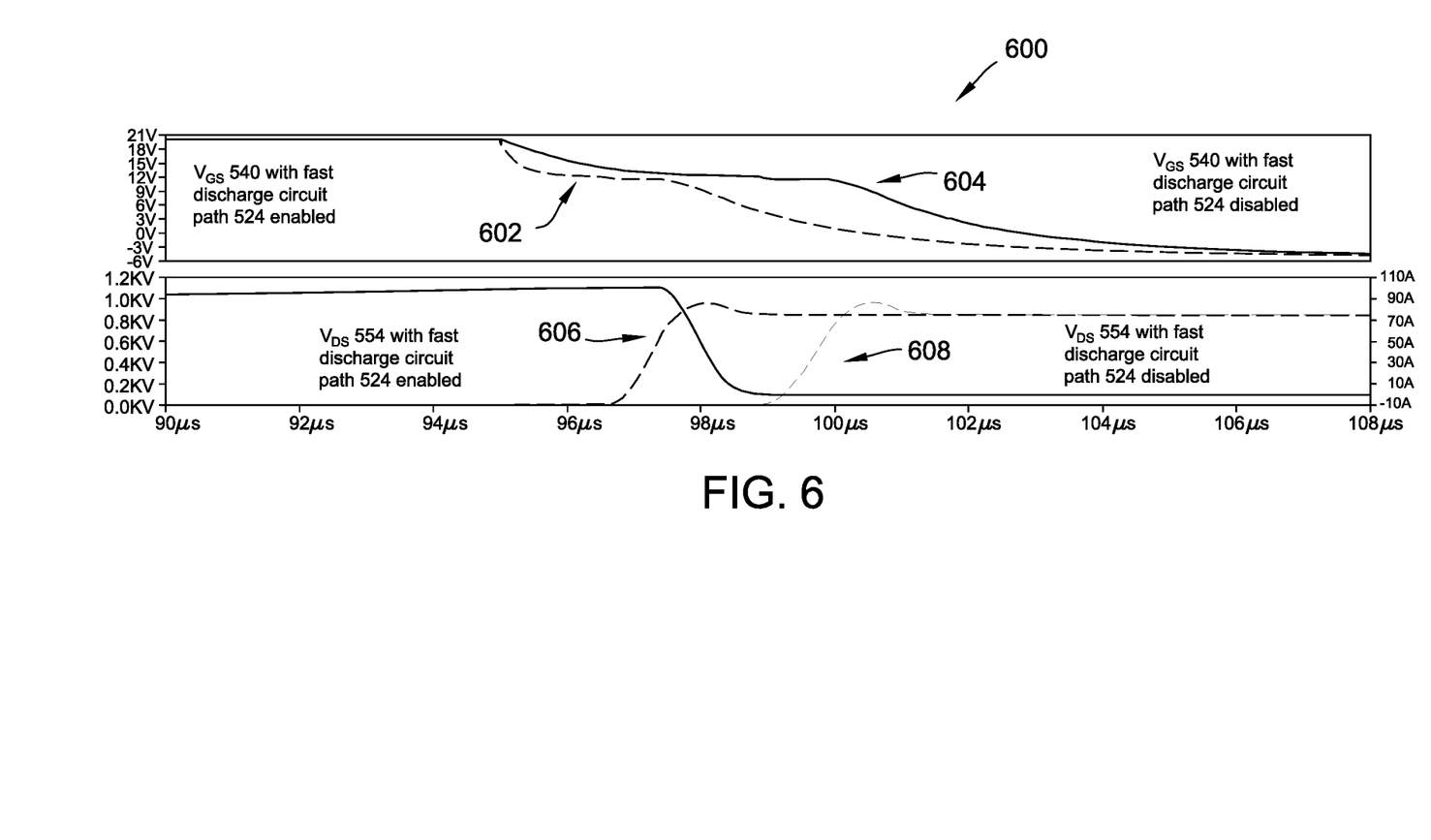
FIG. 6 depicts switching waveforms for the solid-state circuit breaker of FIG. 5.

FIG. 6 depicts switching waveforms 600 for solid-state switch 504 during turn-off, with waveform 602 depicting $V_{GS}$ 540 with fast discharge circuit path 524 enabled and waveform 604 depicting $V_{GS}$ 540 with fast discharge circuit path 524 disabled. waveform 606 depicts the voltage across drain 538 and source 536 of solid-state switch 504 ($V_{DS}$ 554) with fast discharge circuit path 524 enabled and waveform 608 depicts $V_{DS}$ 554 with fast discharge circuit path 524 disabled.

Figure 7:
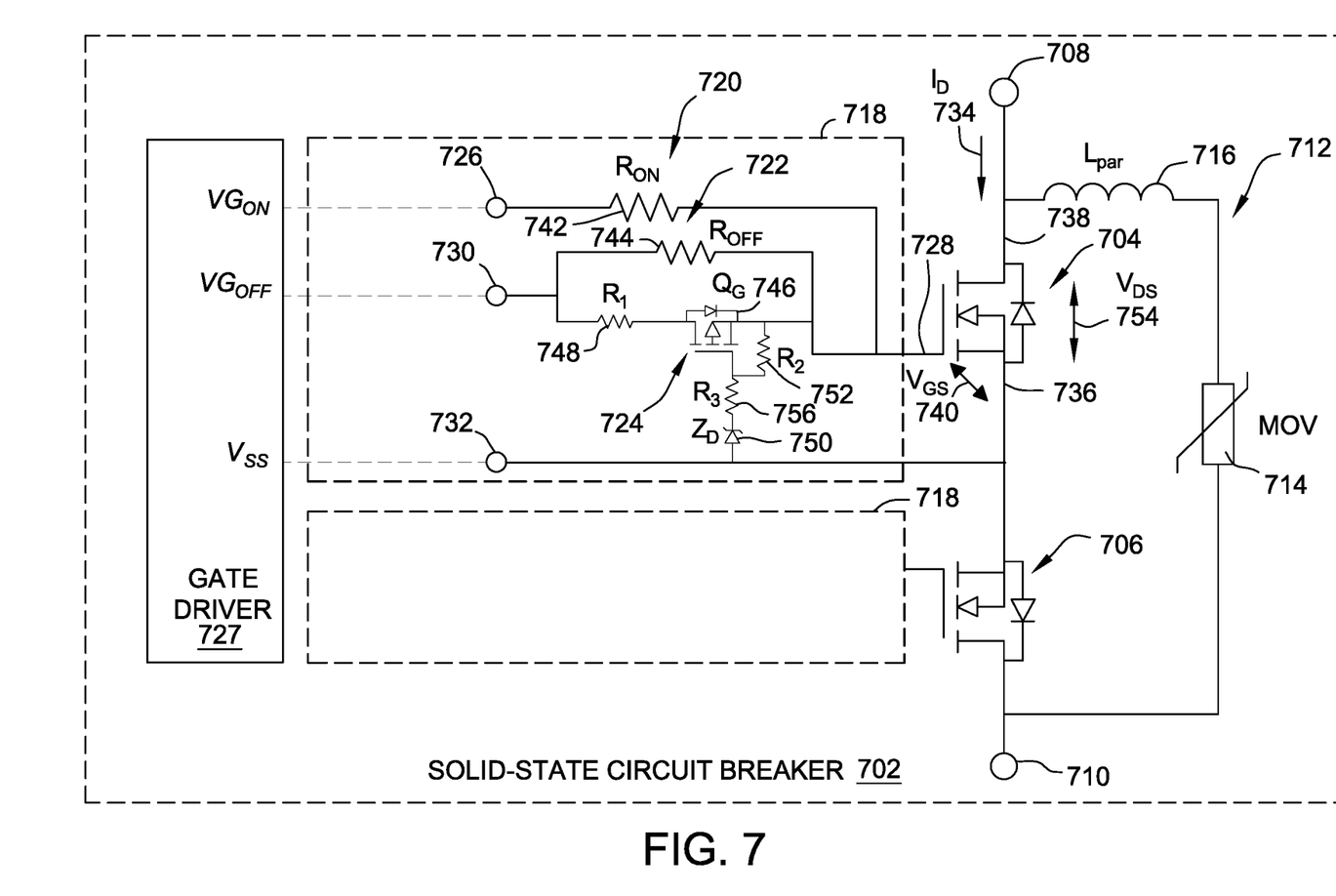
FIG. 7 is a schematic representation of another solid-state circuit breaker in an example embodiment.

FIG. 7 is a schematic representation of a SSCB 702 in an example embodiment. In this embodiment, SSCB 702 includes a pair of anti-series solid-state switches 704, 706 which are used to selectively control a current path through SSCB 702 between output terminals 708, 710 of SSCB 702. Solid-state switches 704, 706 include SiC MOSFETs, IGBTs, GaN FETs, JFETs, etc., in various embodiments. Although solid-state switches 704, 706 are illustrated as n-channel enhancement mode SiC MOSFETs in this embodiment, solid-state switches 704, 706 have other configurations in other embodiments.

In this embodiment, SSCB 702 includes a snubber circuit 712, which mitigates voltage transients across solid-state switches 704, 706 when solid-state switches 704, 706 transition from the on-state to the off-state. The configuration of snubber circuit 712, having a MOV 714 in series with a parasitic inductance component 716 in this embodiment, is different in other embodiments.

In this embodiment, SSCB 702 utilizes an enhanced gate drive circuit 718 to control the operation of solid-state switches 704, 706. The specific details of enhanced gate drive circuit 718 is depicted for solid-state switch 704, to simplify the discussion of SSCB 702. However, enhanced gate drive circuit 718 for solid-state switch 706 may be the same or similar to what will be described with respect to solid-state switch 704.

In this embodiment, enhanced gate drive circuit 718 includes a turn-on circuit path 720, a turn-off circuit path 722, and a fast discharge circuit path 724. Each of circuit paths 720, 722, 724 are individually configurable to modify the operation of enhanced gate drive circuit 718 during turn-on and turn-off transitions for solid-state switch 704. In this embodiment, turn-on circuit path circuit 720 couples a $VG_{ON}$ signal 726 of a gate driver 727 to a gate 728 of solid-state switch 704. $VG_{ON}$ signal 726 is a voltage signal generated by gate driver 727 when gate driver 727 is commanded to turn on solid-state switch 704. Turn-off circuit path 722 couples a $VG_{OFF}$ signal 730 of gate driver 727 to gate 728 of solid-state switch 704. $VG_{OFF}$ signal 730 is a voltage signal generated by gate driver 727 when gate driver 727 is commanded to turn off solid-state switch 704. A $V_{SS}$ signal 732 is a common source signal for solid-state switches 704, 706, and is used by gate driver 727 to level-shift one or more of $VG_{ON}$ signal 726 and $VG_{OFF}$ signal 730. Further in this embodiment, fast discharge circuit path 724 couples $VG_{OFF}$ signal 730 of gate driver 727 with gate 728 of solid-state switch 704.

Turn-on circuit path 720 includes any system, component, or device which is tunable, either statically by component selection or dynamically by other means, to control how solid-state switch 704 transitions from an off-state (e.g., non-conducting) to an on-state (e.g., conducting). For example, turn-on circuit path 720 may be tuned to control the turn-on time of solid-state switch 704 and/or a time rate of change (di/dt) of a drain current ($I_D$) 734 for solid-state switch 704 when solid-state switch 704 transitions from an off-state to an on-state. In this embodiment, turn-on circuit path 720 includes a resistor $R_{ON}$ 742 coupled between $VG_{ON}$ signal 726 of gate driver 727 and gate 728 of solid-state switch 704. $R_{ON}$ 742 has a resistance value selected to control the turn-on time of solid-state switch 704 and/or the di/dt of $I_D$ 734, and also generally has a resistance value that is based on the source current capability of the $VG_{ON}$ signal 726 generated by gate driver 727.

Turn-off circuit path 722 includes any system, component, or device which is tunable, either statically by component selection or dynamically by other means, to control how solid-state switch 704 transitions from an on-state to an off-state during a portion of the turn-off time when fast discharge circuit path 724 is disabled. For example, turn-off circuit path 722 may be tuned to control the turn-off time and/or a time rate of change (di/dt) of $I_D$ 734 for solid-state switch 704 when solid-state switch 704 transitions from an on-state to an off-state beginning at or around $V_{TH}$. Limiting the di/dt of $I_D$ 734 also limits the transient voltages generated in snubber circuit 712 based on the parasitic inductance component $L_{par}$ 716. In this embodiment, turn-off circuit path 722 includes a resistor $R_{OFF}$ 744 coupled between $VG_{OFF}$ signal 730 of gate driver 727 and gate 728 of solid-state switch 704. $R_{OFF}$ 744 has a resistance value selected to control the turn-off time of solid-state switch 704 and/or the di/dt of $I_D$ 734 during the portion of the turn-off time when fast discharge circuit path 724 is disabled (e.g., when $V_{GS}$ 740 is at or about $V_{TH}$ for solid-state switch 704), and also generally has a resistance value that is based on the sink current capability of the $VG_{OFF}$ signal 730 generated by gate driver 727. In this embodiment, turn-off circuit path 722 is coupled in parallel with fast discharge circuit path 724.

Fast discharge circuit path 724 includes any system, component, or device which is tunable, either statically by component selection or dynamically by other means, to control how $V_{GS}$ 740 for solid-state switch 704 transitions from an on-state through the miller plateau voltage to $V_{TH}$ for solid-state switch 704. Fast discharge circuit path 724 providing a low impedance electrical path between gate 728 and $VG_{OFF}$ signal 730 of gate driver 727 while $V_{GS}$ 740 of solid-state switch 704 transitions through the miller plateau voltage to $V_{TH}$. In response to $V_{GS}$ 740 being at or about $V_{TH}$ of solid-state switch 704, fast discharge circuit path 724 is disabled and turn-off circuit path 722 is used to control the turn-off of solid-state switch 704 and to control di/dt of $I_D$ 734.

In this embodiment, fast discharge circuit path 724 includes a p-channel FET $Q_G$ 746 is series with a resistor $R_1$ 748 between gate 728 of solid-state switch 704 and $VG_{OFF}$ signal 730 of gate driver 727. A resistor $R_2$ 752 is coupled between a source of $Q_G$ 746 and a gate of $Q_G$ 746. A resistor $R_3$ 756 is coupled between the gate of $Q_G$ 746 and a cathode of a Zener diode $Z_D$ 750. An anode of $Z_D$ 750 is coupled to $V_{SS}$ signal 732.

During turn-off events for solid-state switch 704, a low impedance path exits between $VG_{OFF}$ signal 730 and gate 728 through $Q_G$ 746 and $R_1$ 748 while $V_{GS}$ 740>$V_Z$+|$V_{TQG}$|, where $V_{TQG}$ is the threshold voltage for $Q_G$ 746 and $V_Z$ is the Zener breakdown voltage for $Z_D$ 750.

When $V_{GS}$ 740<$V_Z$+|$V_{TQG}$|, the low impedance path through $Q_G$ 746 and $R_1$ 748 is disabled, and the discharge path is through $R_{OFF}$ 744. Generally, $V_Z$ is equal to about $V_{GSP}$-|$V_{TQG}$|, where $V_{GSP}$ is the gate plateau voltage of solid-state switch 704. $R_1$ 748 is selected based on the turn-off delay desired for solid-state switch 704 and $R_3$ 756 is based on the discharge rate of $V_{SGQG}$. $V_{SGQG}$ is the voltage from the source-to-gate terminal of solid-state switch 704.

$R_2$ 752 is any value a few times greater than $R3$ 756 to ensure that the gate discharge after $V_{SGQG}$ is discharged below its threshold. $R_2$ 752 will discharge the gate-to-source parasitic capacitance of $Q_G$ 746 and is used to ensure that $Q_G$ 746 is in an off state when disabling fast discharge circuit path 724.

Figure 8:
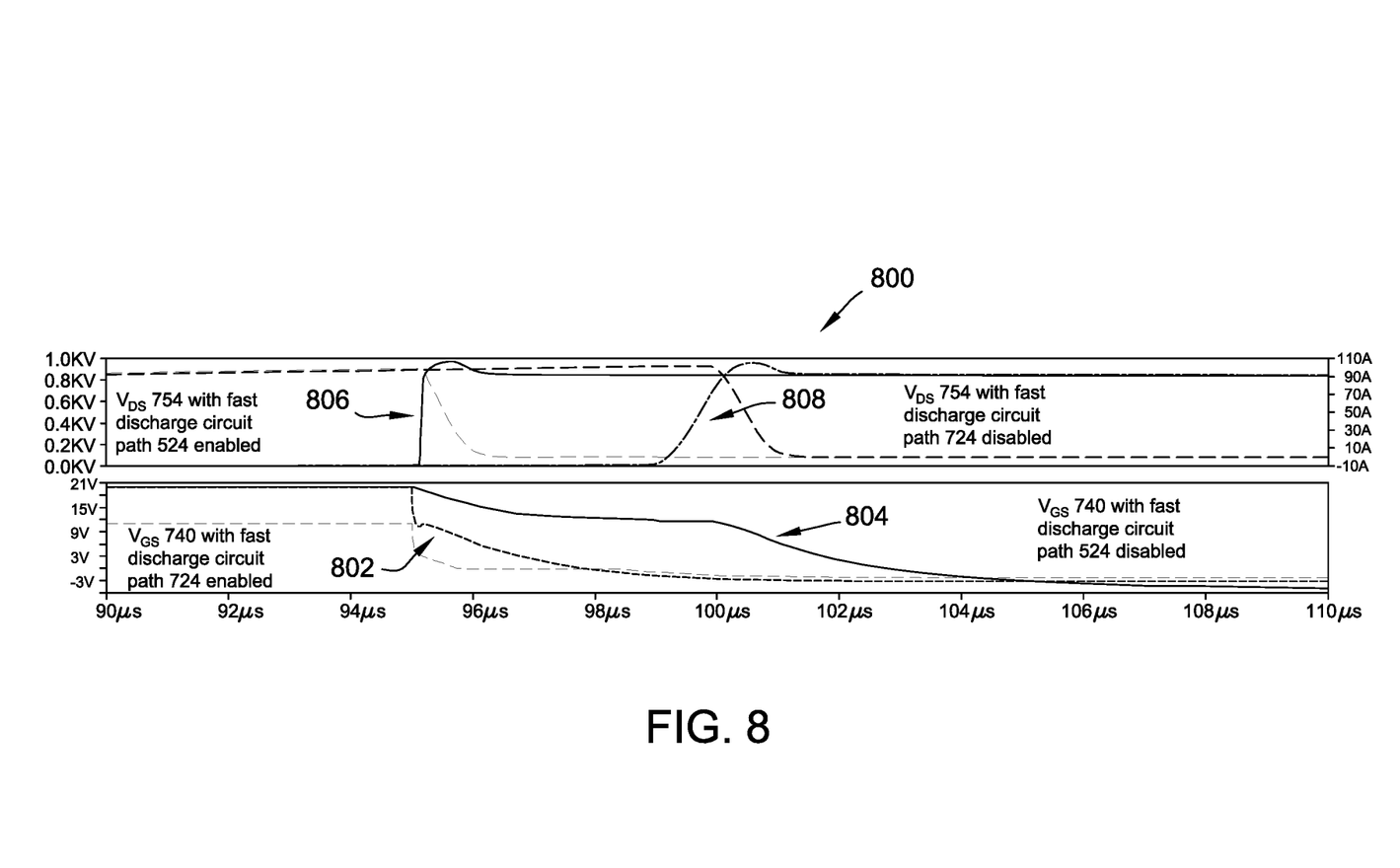
FIG. 8 depicts switching waveforms for the solid-state circuit breaker of FIG. 7.

FIG. 8 depicts switching waveforms 800 for solid-state switch 704 during turn-off, with waveform 802 depicting $V_{GS}$ 740 with fast discharge circuit path 724 enabled and waveform 804 depicting $V_{GS}$ 740 with fast discharge circuit path 724 disabled. Waveform 806 depicts the voltage across drain 738 and source 736 of solid-state switch 704 ($V_{DS}$ 754) with fast discharge circuit path 724 enabled and waveform 808 depicting $V_{DS}$ 754 with fast discharge circuit path 724 disabled.

The embodiments described herein provide enhanced gate driver circuits for solid-state switches that are tunable in both turn-off performance and turn-on performance, thereby providing technical benefits over the art. The technical benefits of the enhanced gate driver circuits described herein include, at least: (a) reducing turn-off delay for solid-state switches while providing for an independent adjustment of the turn-off time for the solid-state switches in order to reduce di/dt in switched currents; (b) reducing the cost and complexity of snubber circuits for the solid-state switches by minimizing voltage overshoot across the solid-state switches during turn-off events; and (c) enable the use of a wider variety of solid-state switch devices in SSCBs, including wide-bandgap devices such as SiC MOSFETs, IGBTs, Gallium Nitride FETs, Junction-gate FETs, etc.

Example embodiments of apparatus and a method for detecting overcurrent faults are described in detail. The apparatus and method are not limited to the specific embodiments described herein, but rather, components of systems and/or steps of the methods may be utilized independently and separately from other components and/or steps described herein. For example, the method may also be used in combination with other components and are not limited to practice only with the circuits as described herein. Rather, the example embodiment can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A gate driver circuit, comprising:
   a turn-on circuit path couplable between a gate of a solid-state switch and a voltage turn-on signal ($VG_{ON}$) from a gate driver, wherein the turn-on circuit path defines a turn-on time for the solid-state switch;
   a turn-off circuit path couplable between the gate of the solid-state switch and a voltage turn-off signal ($VG_{OFF}$) from the gate driver, wherein the turn-off circuit path defines a turn-off time for the solid-state switch; and
   a fast discharge circuit path selectively couplable in parallel with the turn-off circuit path during a portion of a gate-to-source voltage ($V_{GS}$) transition for the solid-state switch, wherein the turn-off circuit path in parallel with the fast discharge circuit path defines a turn-off delay for the solid-state switch,
   wherein each of the turn-on time, the turn-off time, and the turn-off delay are independently configurable.

2. The gate driver circuit of claim 1, wherein:
   the portion of the $V_{GS}$ transition where the fast discharge circuit path is in parallel with the turn-off circuit path is between about $VG_{ON}$ and about a threshold voltage $V_{TH}$ of the gate of the solid-state switch.

3. The gate driver circuit of claim 1, wherein:
   the turn-off circuit path defines the turn-off time based on a target maximum di/dt for a drain current of the solid-state switch.

4. The gate driver of claim 1, wherein:
   the fast discharge circuit path comprises:
      a first resistor having a first terminal coupled to $VG_{OFF}$ and a second terminal;
      a n-channel Field-Effect Transistor (FET) having a drain coupled to the gate of the solid-state switch, a source coupled to the second terminal of the first resistor, and a gate;
      a Zener diode having a cathode coupled to the drain of the n-channel FET and an anode coupled to the gate of the n-channel FET; and
      a second resistor having a third terminal coupled to the gate of the n-channel FET and a fourth terminal coupled to the source of the n-channel FET.

5. The gate driver circuit of claim 4, wherein:
   the turn-off circuit path comprises a third resistor having a fifth terminal coupled to $VG_{OFF}$ and a sixth terminal coupled to the gate of the solid-state switch.

6. The gate driver circuit of claim 4, wherein:
   the n-channel FET conducts when $|VG_{OFF}|+V_{GS}-V_{TOG}>V_Z$, where $V_{TOG}$ is a threshold voltage for the n-channel FET and $V_Z$ is a Zener breakdown voltage for the Zener diode.

7. The gate driver circuit of claim 6, wherein:
   $V_Z$ is equal to about $|VG_{OFF}|+V_{GSP}$, where $V_{GSP}$ is a gate plateau voltage of the solid-state switch.

8. The gate driver circuit of claim 1, wherein:
   the fast discharge circuit path comprises:
      a first resistor having a first terminal coupled to $VG_{OFF}$ and a second terminal;
      a p-channel Field-Effect Transistor (FET) having a source coupled to the gate of the solid-state switch, a drain coupled to the second terminal of the first resistor, and a gate;
      a second resistor having a third terminal coupled to the source of the p-channel FET and a fourth terminal coupled to the gate of the p-channel FET;
      a third resistor having a fifth terminal coupled to the gate of the p-channel FET and a sixth terminal; and
      a Zener diode having a cathode coupled to the sixth terminal of the third resistor and an anode coupled to a source of the solid-state switch.

9. The gate driver circuit of claim 8, wherein:
   the p-channel FET conducts when $V_{GS}>V_Z+|V_{TOG}|$, where $V_{TOG}$ is a threshold voltage for the p-channel FET and $V_Z$ is a Zener breakdown voltage for the Zener diode.

10. The gate driver circuit of claim 8, wherein:
the turn-off circuit path comprises a fourth resistor having a seventh terminal coupled to $VG_{OFF}$ and a eighth terminal coupled to the gate of the solid-state switch.

11. A solid-state circuit breaker, comprising:
a first output terminal;
a second output terminal;
at least one gate driver configured to generate a turn-on signal $VG_{ON}$ and a turn-off signal $VG_{OFF}$;
a pair of anti-series solid-state switches selectively coupling the first output terminal with the second output terminal; and
a gate driver circuit coupled to the at least one gate driver and a first solid-state switch of the pair of anti-series solid-state switches, the gate driver circuit comprising:
  a turn-on circuit path coupled between a gate of the first solid-state switch and $VG_{ON}$, wherein the turn-on circuit path defines a turn-on time for the first solid-state switch;
  a turn-off circuit path coupled between the gate of the first solid-state switch and $VG_{OFF}$, wherein the turn-off circuit path defines a turn-off time for the first solid-state switch; and
  a fast discharge circuit path selectively coupled in parallel with the turn-off circuit path during a portion of a gate-to-source voltage ($V_{GS}$) transition for the first solid-state switch, wherein the turn-off circuit path in parallel with the fast discharge circuit path defines a turn-off delay for the first solid-state switch,
  wherein each of the turn-on time, the turn-off time, and the turn-off delay are independently configurable.

12. The solid-state circuit breaker of claim 11, wherein:
the portion of the $V_{GS}$ transition where the fast discharge circuit path is in parallel with the turn-off circuit path is between about $VG_{ON}$ and about a threshold voltage $V_{TH}$ of the gate of the first solid-state switch.

13. The solid-state circuit breaker of claim 11, wherein:
the turn-off circuit path defines the turn-off time based on a target maximum di/dt for a fault current for the solid-state circuit breaker.

14. The solid-state circuit breaker of claim 11, wherein:
the fast discharge circuit path comprises:
  a first resistor having a first terminal coupled to $VG_{OFF}$ and a second terminal;
  a n-channel Field-Effect Transistor (FET) having a drain coupled to the gate of the first solid-state switch, a source coupled to the second terminal of the first resistor, and a gate;
  a Zener diode having a cathode coupled to the drain of the n-channel FET and an anode coupled to the gate of the n-channel FET; and
  a second resistor having a third terminal coupled to the gate of the n-channel FET and a fourth terminal coupled to the source of the n-channel FET.

15. The solid-state circuit breaker of claim 14, wherein:
the turn-off circuit path comprises a third resistor having a fifth terminal coupled to $VG_{OFF}$ and a sixth terminal coupled to the gate of the first solid-state switch.

16. The solid-state circuit breaker of claim 15, wherein:
the n-channel FET conducts when $|VG_{OFF}|+V_{GS}-V_{TOG}>V_Z$, where $V_{TOG}$ is a threshold voltage for the n-channel FET and $V_Z$ is a Zener breakdown voltage for the Zener diode.

17. The solid-state circuit breaker of claim 16, wherein:
$V_Z$ is equal to about $|VG_{OFF}|+V_{GSP}$, where $V_{GSP}$ is a gate plateau voltage of the first solid-state switch.

18. The solid-state circuit breaker of claim 11, wherein:
the fast discharge circuit path comprises:
  a first resistor having a first terminal coupled to $VG_{OFF}$ and a second terminal;
  a p-channel Field-Effect Transistor (FET) having a source coupled to the gate of the first solid-state switch, a drain coupled to the second terminal of the first resistor, and a gate;
  a second resistor having a third terminal coupled to source of the p-channel FET and a fourth terminal coupled to the gate of the p-channel FET;
  a third resistor having a fifth terminal coupled to the gate of the p-channel FET and a sixth terminal; and
  a Zener diode having a cathode coupled to the sixth terminal of the third resistor and an anode coupled to a source of the first solid-state switch.

19. The solid-state circuit breaker of claim 18, wherein:
the p-channel FET conducts when $V_{GS}>V_Z+|V_{TOG}|$, where $V_{TOG}$ is a threshold voltage for the FET and $V_Z$ is a Zener breakdown voltage for the Zener diode.

20. An apparatus comprising:
a gate driver configured to generate a turn-off signal $VG_{OFF}$;
a solid-state switch including a gate, a drain, and a source;
a turn-off circuit path coupled between the gate of the solid-state switch and $VG_{OFF}$; and
a fast discharge circuit path comprising one of:
  a first circuit comprising a first resistor having a first terminal coupled to $VG_{OFF}$ and a second terminal, a n-channel Field-Effect Transistor (FET) having a drain coupled to the gate of the solid-state switch, a source coupled to the second terminal of the first resistor, and a gate, a first Zener diode having a cathode coupled to the drain of the n-channel FET and an anode coupled to the gate of the n-channel FET, and a second resistor having a third terminal coupled to the gate of the n-channel FET and a fourth terminal coupled to the source of the n-channel FET; and
  a second circuit comprising a third resistor having a fifth terminal coupled to $VG_{OFF}$ and a sixth terminal, a p-channel FET having a source coupled to the gate of the solid-state switch, a drain coupled to the sixth terminal of the third resistor, and a gate, a fourth resistor having a seventh terminal coupled to the source of the p-channel FET and a eighth terminal coupled to the gate of the p-channel FET, a fifth resistor having a ninth terminal coupled to the gate of the p-channel FET and a tenth terminal, and a second Zener diode having a cathode coupled to the tenth terminal of the fifth resistor and an anode coupled to a source of the solid-state switch.

* * * * *